(12) United States Patent
Yen

(10) Patent No.: US 7,221,304 B2
(45) Date of Patent: May 22, 2007

(54) APPARATUS FOR DRIVING DISPLAY PANEL AND DIGITAL-TO-ANALOG CONVERTER THEREOF

(75) Inventor: Chih-Jen Yen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/164,545

(22) Filed: Nov. 29, 2005

(65) Prior Publication Data

US 2007/0090983 A1 Apr. 26, 2007

(30) Foreign Application Priority Data

Oct. 24, 2005 (TW) .............................. 94137099 A

(51) Int. Cl.
*H03M 1/66* (2006.01)
(52) U.S. Cl. ...................................... 341/145; 341/154
(58) Field of Classification Search ................ 341/144, 341/154, 145
See application file for complete search history.

(56) References Cited

U.S. PATENT DOCUMENTS

| | | | | |
|---|---|---|---|---|
| 5,469,164 A | * | 11/1995 | Kemp | 341/145 |
| 5,648,780 A | * | 7/1997 | Neidorff | 341/154 |
| 6,181,265 B1 | * | 1/2001 | Lee | 341/145 |
| 6,191,720 B1 | * | 2/2001 | Zhang | 341/145 |
| 6,466,149 B2 | * | 10/2002 | Tabler | 341/144 |
| 6,954,165 B2 | * | 10/2005 | Mallinson | 341/144 |
| 6,995,701 B1 | * | 2/2006 | Churchill et al. | 341/154 |
| 7,015,847 B1 | * | 3/2006 | McLachlan et al. | 341/145 |
| 2002/0033763 A1 | * | 3/2002 | Nakao | 341/154 |

* cited by examiner

*Primary Examiner*—Linh Nguyen
(74) *Attorney, Agent, or Firm*—Jianq Chyun IP Office

(57) ABSTRACT

An apparatus for driving display panel and a digital-to-analog converter (DAC) thereof are provided. The (M+L)-bit digital data provided by the timing controller is converted into N-channel analog output voltages to control and drive the display panel. The number of the analog voltage lines and the number of the selection switches of the (M+L)-bit DAC in the apparatus for driving display panel can be greatly reduced according to the present invention. Compared to the conventional technology, the chip area of the apparatus for driving display panel is reduced and the cost is thus minimized.

20 Claims, 6 Drawing Sheets

of different levels to each of the DACs 201-1 to 201-N. Each of the DACs 201-1 to 201-N respectively selects one of the analog voltages Y(1) to Y($2^{M+L}$) provided by the reference voltage source 107 based on the corresponding digital data output by the level shifter 104, and transmits the selected voltage level to the display panel through the output buffer 106.

APPARATUS FOR DRIVING DISPLAY PANEL AND DIGITAL-TO-ANALOG CONVERTER THEREOF

CROSS-REFERENCE TO RELATED APPLICATION

This application claims the priority benefit of Taiwan application serial no. 94137099, filed on Oct. 24, 2005. All disclosure of the Taiwan application is incorporated herein by reference.

BACKGROUND OF THE INVENTION

1. Field of Invention

The present invention relates to a digital-to-analog converter. More particularly, the present invention relates to a digital-to-analog converter which can greatly reduce the layout area of analog voltage lines.

2. Description of Related Art

The apparatus for driving a display panel, e.g. an liquid crystal display (LCD) panel, is used for controlling and driving display panel according to the digital input data output by a timing controller. FIG. 1 is a block diagram illustrating a conventional N-channel, (M+L)-bit driving apparatus. Referring to FIG. 1, a shift register 101, a first line latch 102, a second line latch 103, a level shifter 104, an (M+L)-bit digital-to-analog converter (DAC) 105, a reference voltage source 107, and an N-channel output buffer 106 are included.

The clock signal CLK and the first control signal CT1 are used for activating the shift register 101, and the second control signal CT2 is used for controlling the second line latch 103. When the first control signal CT1 goes to a high level, the shift register 101 gradually shifts the received first control signal CT1 based on the clock signal CLK to output (N/3) latch signals of different phases to the first line latch 102. The first line latch 102 receives and latches the (M+L)-bit red, green, and blue (RGB) digital input data streams Din1, Din2, and Din3 based on the latch signals output by the shift register 101. When the digital input data streams of the entire line have been latched to the first line latch 102, the second control signal CT2 goes to a high level, accordingly, the data latched in the first line latch 102 is transmitted and latched to the second line latch 103. The level shifter 104 converts the digital data latched in the second line latch 103 into data of higher voltage level so as to accurately drive the digital-to-analog conversion unit 105. The digital-to-analog conversion unit 105 produces the corresponding analog output data based on the digital latch data output by the level shifter 104 and the analog voltage provided by the reference voltage source 107. The output buffer 106 is used for enhancing the driving capability to the output load and bringing the output to an expected analog voltage level. Then, the clock signal CLK and the first control signal CT1 become high level again, the data in the first line latch 102 is updated and latched. The above operations will be executed repeatedly.

FIG. 2 is a block diagram illustrating a conventional (M+L)-bit digital-to-analog conversion unit 105. Referring to FIG. 2, the digital-to-analog conversion unit 105 includes DACs 201-1, 201-2 ... 201-N. The reference voltage source 107 provides $2^{M+L}$ analog voltages Y(1), Y(2) ... Y($2^{M+L}$) of different levels to the digital-to-analog conversion unit 105 through $2^{M+L}$ analog voltage lines. The $2^{M+L}$ analog voltage lines pass through the digital-to-analog conversion unit 105 to transmit the $2^{M+L}$ analog voltages Y(1) to The disadvantage of the conventional display panel driving apparatuses shown in FIGS. 1 and 2 is that the analog voltage lines in the digital-to-analog conversion unit 105 take a lot of chip area, in particular, the higher the resolution, the larger the area taken by the analog voltage lines. For example, if (M+L) is 8-bit, then $2^8$ (i.e. 256) analog voltage lines are required in the digital-to-analog conversion unit 105. If (M+L) is 10-bit (to increase the resolution), then $2^{10}$ (i.e. 1024) analog voltage lines are required in the digital-to-analog conversion unit 105. Accordingly, the chip area thereof will be very large and the manufacturing cost of the apparatus for driving display panel will be increased considerably.

SUMMARY OF THE INVENTION

Accordingly, the present invention is directed to provide an apparatus for driving display panel, which will greatly reduce the number of analog voltage lines in the digital-to-analog conversion unit thereof, and the chip area is saved and the manufacturing cost is lowered accordingly.

According to another aspect of the present invention, a digital-to-analog converter (DAC) is provided to greatly reduce the analog voltage lines required thereof, and to reduce the chip area and the manufacturing cost accordingly.

According to yet another aspect of the present invention, another DAC with another structure is provided, which achieves the objects mentioned above.

Based on the aforementioned and other objects, the present invention provides an apparatus for driving display panel, which includes a data latch unit, a reference voltage source, and a digital-to-analog conversion unit. The data latch unit receives and latches the input data stream, and outputs N digital latch data based on the latch result. Wherein, each digital latch data is (M+L)-bit, and N, M, and L are all positive integers greater than 0. The reference voltage source provides $2^M+1$ coarse analog voltages V(i) of different levels, wherein V(i) represents the $i^{th}$ coarse analog voltage, and i is an integer, 0<i≦$2^M$+1. The digital-to-analog conversion unit is coupled to the data latch unit and the reference voltage source. The digital-to-analog conversion unit includes N DACs, wherein each DAC respectively selects two of the coarse analog voltages based on the M-bit first portion data in the corresponding digital latch data, and respectively produces the corresponding analog output data based on the selected two coarse analog voltages and the L-bit second portion data in the corresponding digital latch data.

According to another aspect of the present invention, a DAC is provided for outputting the corresponding analog output data based on the (M+L)-bit digital data, and M and L are both positive integers greater than 0. The DAC includes a coarse selector, a voltage divider, and an output selector. The coarse selector selects the coarse analog voltages V(j) and V(j−1) from the received $2^M$+1 coarse analog voltages V(i) of different levels based on the M-bit first portion data in the digital data. Wherein, V(i) represents the $i^{th}$ coarse analog voltage, i and j are integers, and 0<i≦$2^M$+1, 1<j≦$2^M$+1. The voltage divider is electrically connected to the coarse selector and is used for voltage dividing based on the coarse analog voltages V(j) and V(j−1) selected by the coarse selector to produce $2^L$ fine analog voltages of different levels. The output selector is electrically connected to the voltage divider and is used for selecting one of the fine analog voltages based on the L-bit second portion data in the digital data and outputting it as the analog output data.

The present invention provides another DAC for receiving $2^M+1$ coarse analog voltages V(i) of different levels and outputting the corresponding analog output data based on the (M+L)-bit digital data. Wherein, V(i) represents the $i^{th}$ coarse analog voltage, i, M, and L are all positive integers and $0<i\leq 2^M+1$. The DAC includes a first selector, a second selector, a voltage divider, and an output selector. The first selector selects the coarse analog voltage V(j) from the coarse analog voltages V(2) to V($2^M+1$) based on the M-bit first portion data in the digital data, wherein j is an integer and $1<j\leq 2^M+1$. The second selector selects the coarse analog voltage V(j−1) from the coarse analog voltages V(1) to V($2^M$) based on the M-bit first portion data in the digital data. The voltage divider is electrically connected to the first selector and the second selector and is used for voltage dividing based on the coarse analog voltages V(j) and V(j−1) selected respectively by the first selector and the second selector to produce $2^L$ fine analog voltages of different levels. The output selector is electrically connected to the voltage divider and is used for selecting one of the fine analog voltages based on the L-bit second portion data in the digital data and outputting it as the analog output data.

According to the present invention, the (M+L)-bit digital latch data is divided into the M-bit first portion data and the L-bit second portion data, and then the DAC selects two coarse analog voltages from the $2^M+1$ coarse analog voltages based on the first portion data and then produces the corresponding analog output data based on the second portion data and the selected two coarse analog voltages, accordingly, only $2^M+1$ coarse analog voltage lines are required in the DAC of the present invention. Compared to the conventional technology, the present invention can greatly reduce the number of analog voltage lines in the digital-to-analog conversion unit from $2^{M+L}$ to $2^M+1$. Accordingly, the chip area is diminished and thus the manufacturing cost can be reduced.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 3:
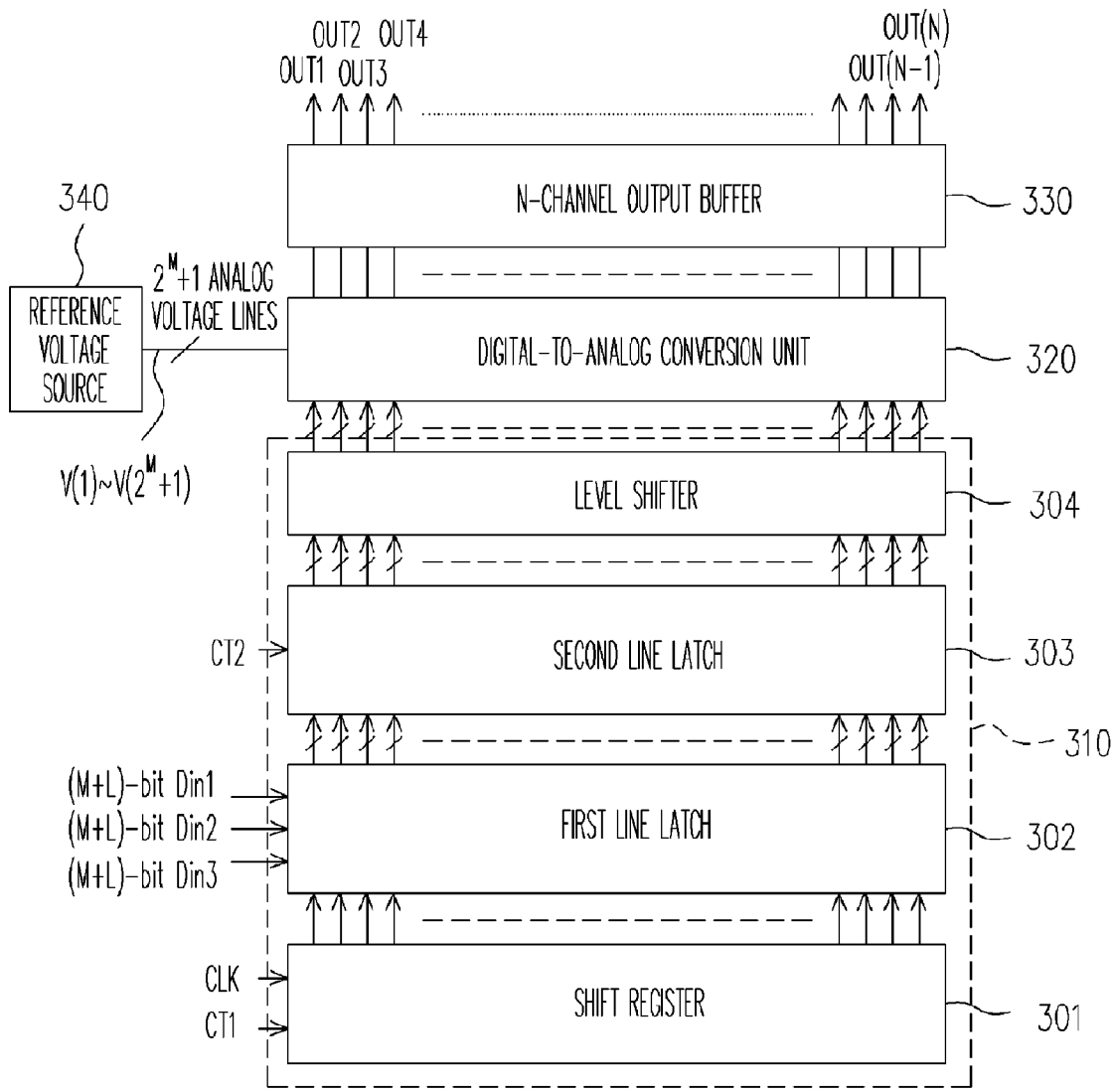
FIG. 3 is a block diagram illustrating an apparatus for driving display panel according to an embodiment of the present invention.

Compared to the conventional structure, in the display panel driving apparatus of the present invention, the number of analog voltage lines in the digital-to-analog conversion unit can be greatly reduced. FIG. 3 is a block diagram illustrating an apparatus for driving display panel according to an embodiment of the present invention. Referring to FIG. 3, a data latch unit 310, a reference voltage source 340, a (M+L)-bit digital-to-analog conversion unit 320, and N-channel output buffer 330 are included. The data latch unit 310 receives and latches at least one (M+L)-bit input data stream (red, green, and blue digital input data stream Din1, Din2, and Din3 here) and outputs N digital latch data based on the latch result thereof, wherein N, M, and L are all positive integers greater than 0. In the present embodiment, the data latch unit 310 includes shift registers 301, first line latches 302, second line latches 303, and level shifters 304. The output of the digital-to-analog conversion unit 320 drives a display panel (not shown) through the N-channel output buffer 330. In the present embodiment, the driven display panel may be an LCD panel etc.

The clock signal CLK and the first control signal CT1 are used for activating the shift registers 301, and the second control signal CT2 is used for controlling the second line latches 303. When the first control signal CT1 goes to a high level, the shift register 301 gradually shifts the received first control signal CT1 based on the clock signal CLK to output (N/3) latch signals of different phases to the first line latch 302. The first line latch 302 receives and latches (M+L)-bit red, green, and blue (RGB) digital input data streams Din1, Din2, and Din3 based on the latch signals output by the shift register 301. When the digital input data streams of the entire horizontal line have been latched in the first line latch 302, the second control signal CT2 goes to a high level, accordingly, the data latched in the first line latch 302 is transmitted and latched to the second line latch 303. The level shifter 304 converts the digital data latched in the second line latch 303 into data of higher voltage level to accurately drive the digital-to-analog conversion unit 320. The digital-to-analog conversion unit 320 produces the corresponding analog output data based on the digital latch data output by the level shifter 304 and the analog voltage provided by the reference voltage source 340. The output buffer 330 is used for enhancing the driving capability to the output load and bringing the output to an expected analog voltage level. Then, the clock signal CLK and the first control signal CT1 become high level again, the data in the first line latch 302 is updated and latched, and the operations described above will be executed repeatedly.

Figure 4:
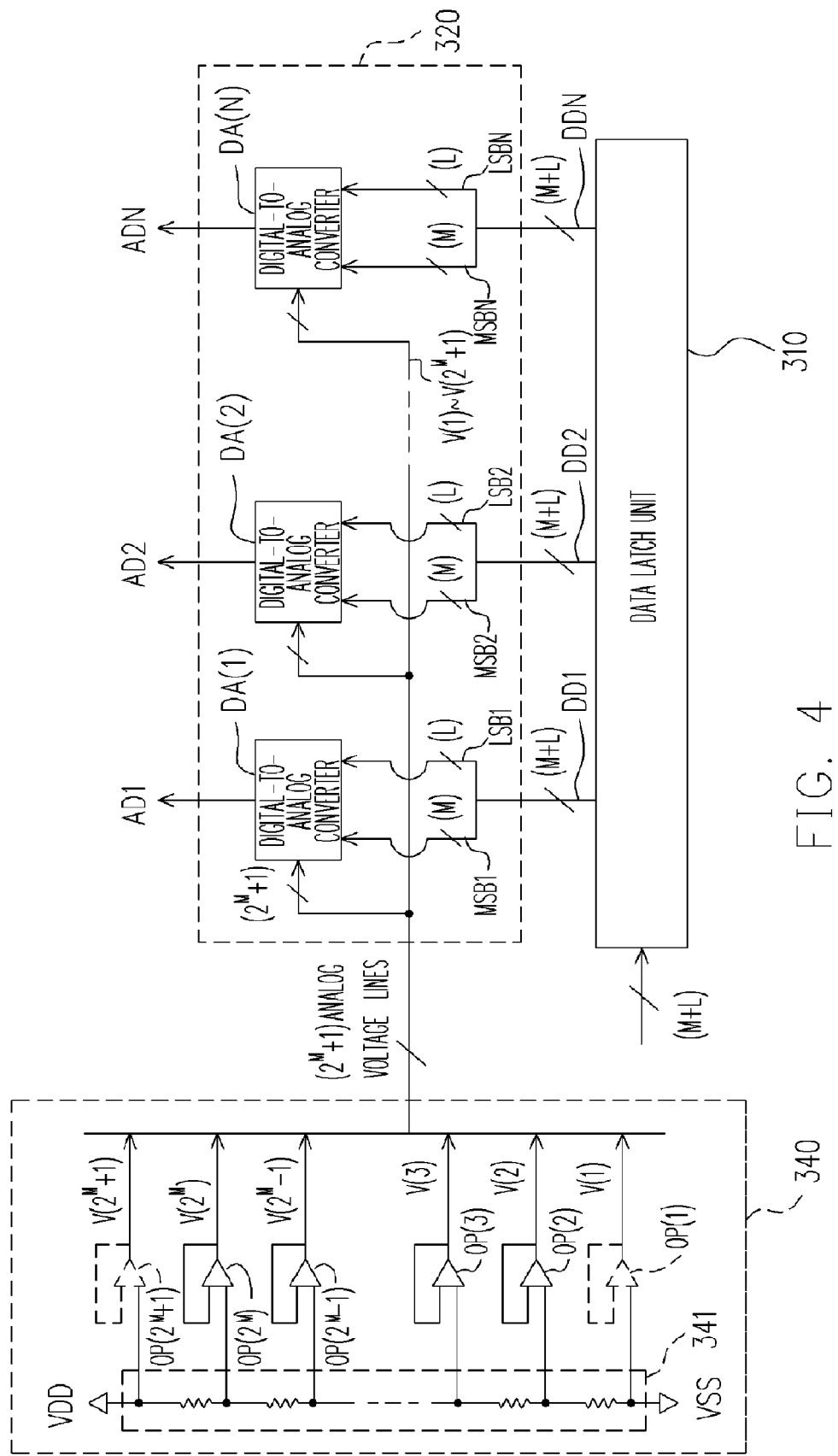
FIG. 4 is a block diagram illustrating the digital-to-analog conversion unit and the reference voltage source in FIG. 3.

FIG. 4 is a block diagram illustrating the digital-to-analog conversion unit 320 and the reference voltage source 340 in FIG. 3. Referring to FIG. 4, the reference voltage source 340 includes a first voltage divider 341 and buffers OP(1) to OP($2^M+1$). The first voltage divider 341 produces $2^M+1$ coarse analog voltages V(1) to V($2^M+1$) of different levels based on a first constant voltage (e.g. the system voltage VDD or the DC voltage output by the first voltage regulator) and a second constant voltage (e.g. the ground voltage VSS or the DC voltage output by the second voltage regulator). The first voltage divider 341 includes at least $2^M$ first resistors connected in series. The input terminals of the buffers OP(1) to OP($2^M$+1) are electrically connected to the first voltage divider 341. The reference voltage source 340 divides voltage using a resistor string so as to provide the coarse analog voltages V(1) to V($2^M$+1) through the output terminals of the buffers OP(1) to OP($2^M$+1) respectively. If V(1) and V($2^M$+1) are produced by directly coupling to the system voltage VDD and the ground voltage VSS respectively, or produced by two DC voltages output by the first and the second voltage regulators, thus, the buffers OP(1) and OP($2^M$+1) can be skipped.

The digital-to-analog conversion unit 320 is coupled to the data latch unit 310 and the reference voltage source 340. The digital-to-analog conversion unit 320 includes N DACs DA(1) to DA(N), wherein each DAC among DACs DA(1) to DA(N) respectively selects two of the coarse analog voltages V(1) to V($2^M$+1) based on one of the M-bit first portion data MSB1 to MSBN in the corresponding digital latch data DD1 to DDN. Then, each DAC respectively produces one of the corresponding analog output data AD1 to ADN based on the selected two coarse analog voltages and one of the L-bit second portion data LSB1 to LSBN in the corresponding digital latch data DD1 to DDN to drive the display panel (not shown).

Figure 1:
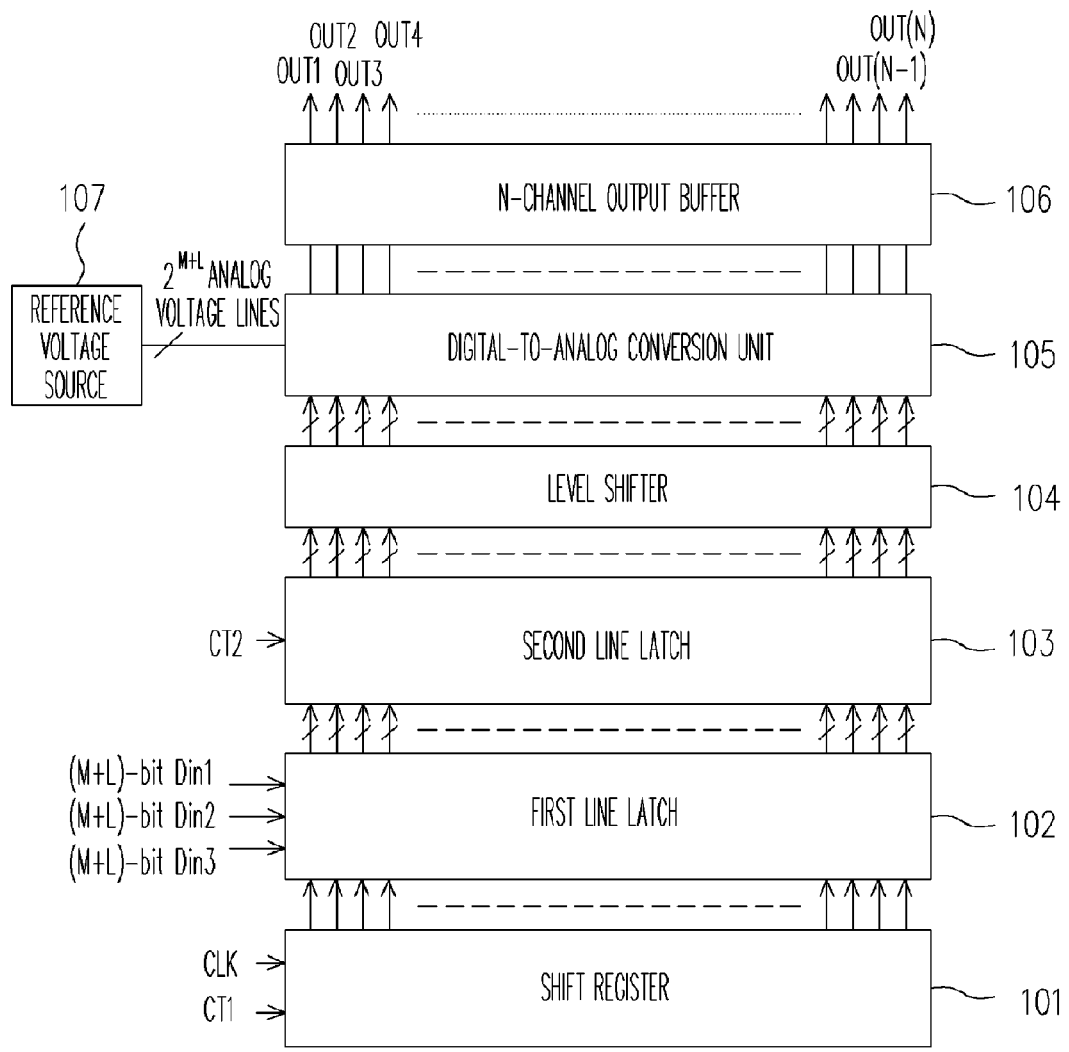
FIG. 1 is a block diagram illustrating a conventional N-channel, (M+L)-bit driving apparatus.
Figure 1:
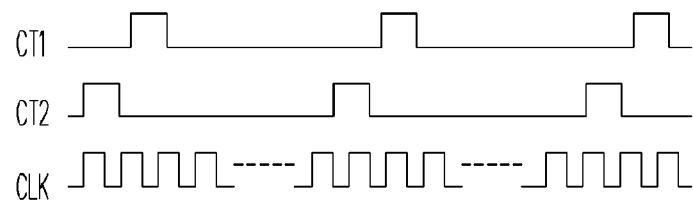
Figure 2:
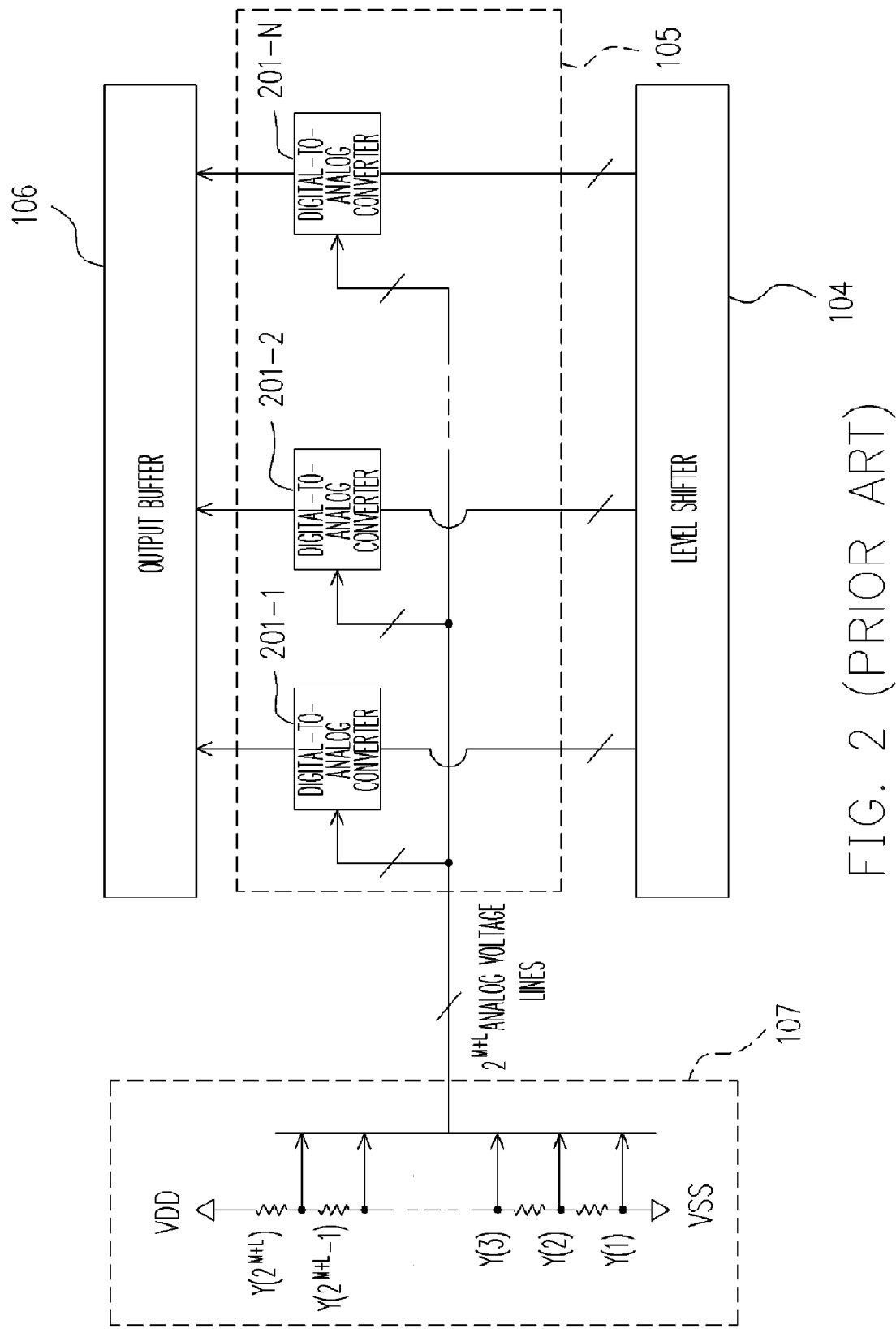
FIG. 2 is a block diagram illustrating a conventional (M+L)-bit digital-to-analog conversion unit 105.

($2^{M+L}$) analog voltage lines are required to be laid out in a conventional digital-to-analog conversion unit (e.g. the digital-to-analog conversion unit 105 as shown in FIG. 2), thus a lot of chip area is taken by the analog voltage lines. In particular, the higher the resolution, the larger the area taken by the analog voltage lines. Compared to the conventional technology, only $2^M$+1 coarse analog voltages V(1) to V($2^M$+1) are required in the digital-to-analog conversion unit 320 of the present embodiment, which means only $2^M$+1 analog voltage lines are required in the present embodiment. For example, if the inputted digital data is 8-bit (i.e. M+L=8) and the high byte and the low byte are respectively 4-bit (i.e. M=L=4), then $2^8$ (i.e. 256) analog voltage lines are required in a conventional digital-to-analog conversion unit, while only $2^4$+1 (i.e. 17) analog voltage lines are required in the present embodiment. If (M+L) is 10-bit (to improve the resolution) and the high byte and the low byte are respectively 5-bit (i.e. M=L=5), then $2^{10}$ (i.e. 1024) analog voltage lines are required in a conventional digital-to-analog conversion unit, while only $2^5$+1 (i.e. 33) analog voltage lines are required in the present embodiment. The aforementioned numbers of bits in the high byte and the low byte (i.e. M and L) are not limited to the definition above. Accordingly, the present invention can greatly reduce the analog voltage lines required in the digital-to-analog conversion unit. Furthermore, the chip area and the manufacturing cost are significantly decreased.

Figure 5:
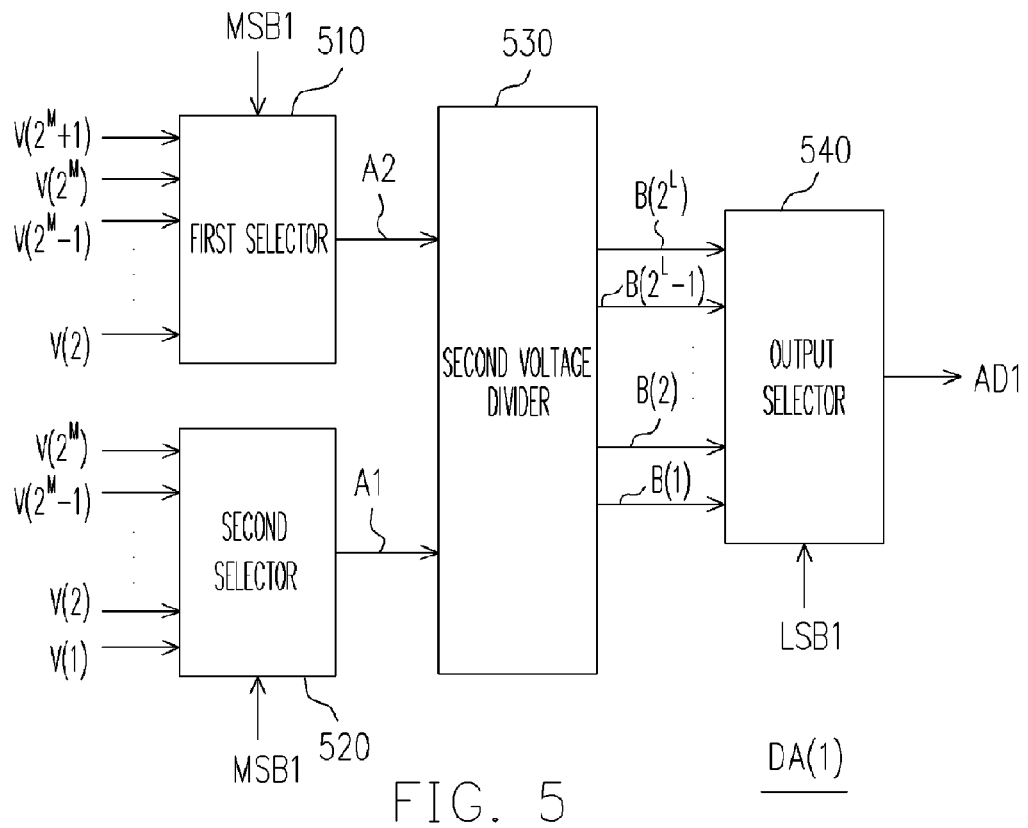
FIG. 5 is a block diagram illustrating the digital-to-analog converter in FIG. 4 according to an embodiment of the present invention.

FIG. 5 is a block diagram illustrating the DAC DA(1) in FIG. 4 according to an embodiment of the present invention. The embodiments of the DACs DA(2) to DA(N) in FIG. 4 can be referred to the embodiment in FIG. 5. Referring to both FIGS. 4 and 5, the DAC DA(1) includes a first selector 510, a second selector 520, a second voltage divider 530, and an output selector 540. The first selector 510 and the second selector 520 are electrically connected to the reference voltage source 340. The first selector 510 selects the coarse analog voltage V(j) from the coarse analog voltages V(2)~V($2^M$+1) output by the reference voltage source 340 based on the M-bit first portion data MSB1 in the corresponding digital data DD1 as the output A2 thereof. The second selector 520 selects the coarse analog voltage V(j−1) from the coarse analog voltages V(1)~V($2^M$) output by the reference voltage source 340 based on the M-bit first portion data MSB1 in the corresponding digital data DD1 as the output A1 thereof. For example, the second selector 520 selects the coarse analog voltage V(2) as the output A1 thereof when the first selector 510 selects the coarse analog voltage V(3) as the output A2 thereof.

The second selector 530 divides voltages based on the coarse analog voltages V(j) and V(j−1) selected by the first selector 510 and the second selector 520 respectively (i.e. the output voltages A2 and A1 thereof) to produce $2^L$ fine analog voltages B(1) to B($2^L$) of different levels. The output selector 540 selects one of the fine analog voltages B(1) to B($2^L$) based on the L-bit second portion data LSB1 in the corresponding digital data DD1 to output it as the analog output data AD1.

Figure 6:
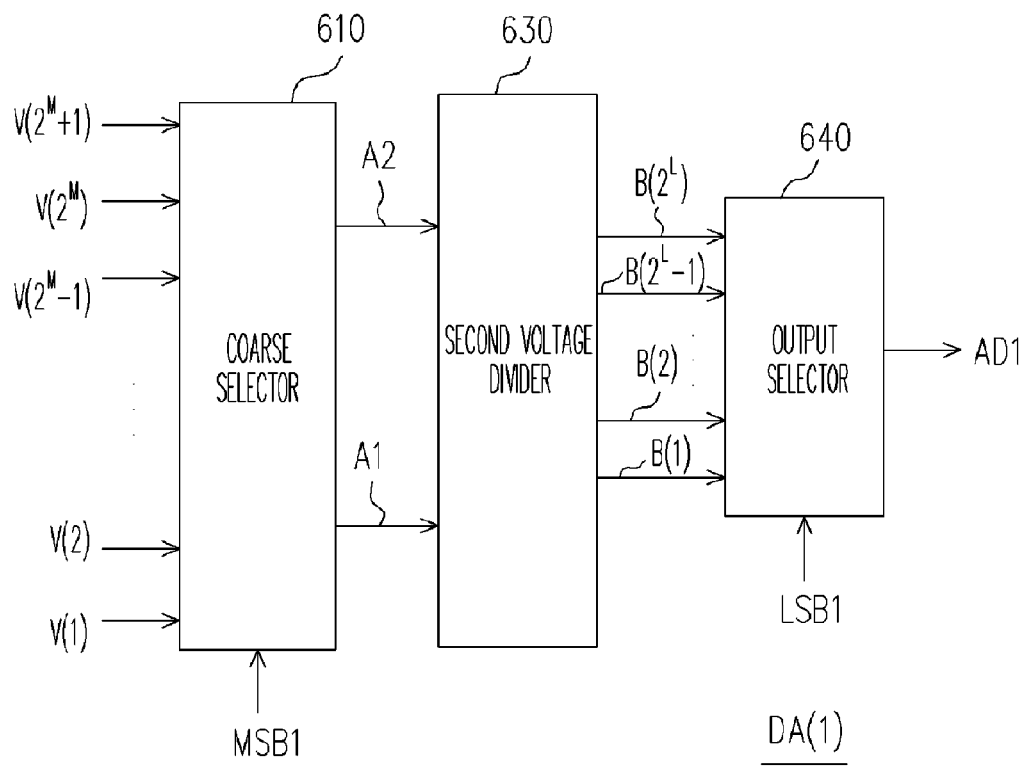
FIG. 6 is a block diagram illustrating the digital-to-analog converter in FIG. 4 according to another embodiment of the present invention.
Figure 7A:
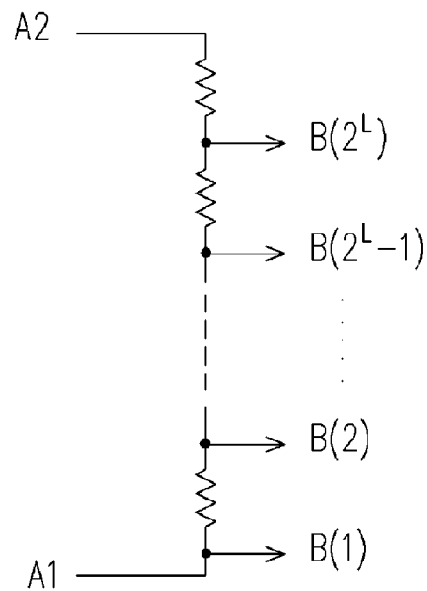
FIGS. 7A to 7D illustrate the second voltage divider according to various embodiments of the present invention.
Figure 7B:
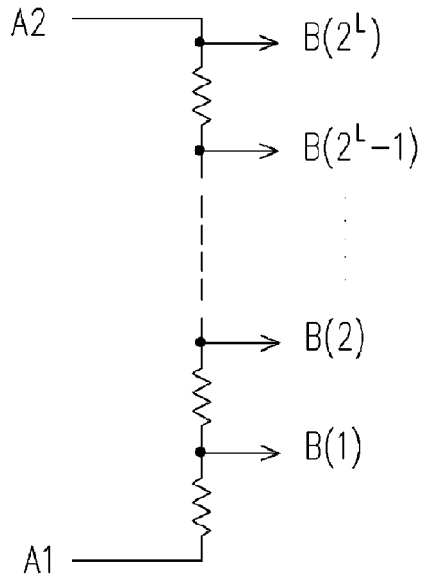
Figure 7C:
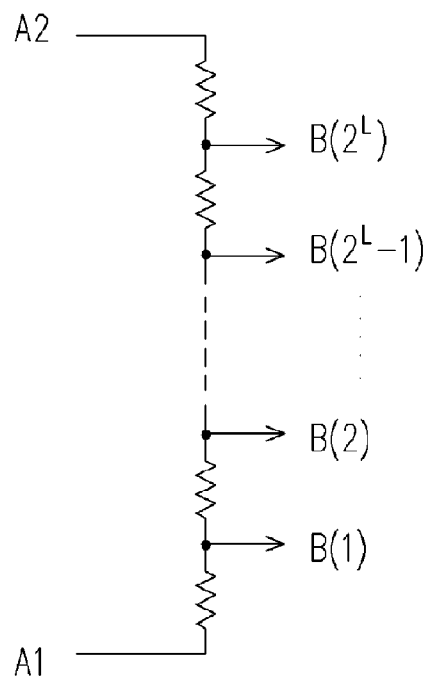
Figure 7D:
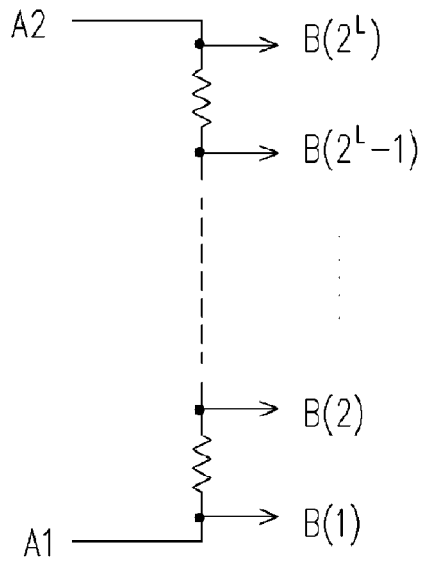

FIG. 6 is a block diagram illustrating the DAC DA(1) in FIG. 4 according to another embodiment of the present invention. The embodiments of the DACs DA(2) to DA(N) in FIG. 4 can also be referred to the embodiment in FIG. 6. Referring to both FIGS. 4 and 6, the DAC DA(1) includes a coarse selector 610, a second voltage divider 630, and an output selector 640. The coarse selector 610 is electrically connected to the reference voltage source 340 and is used for selecting the coarse analog voltages V(j) and V(j−1) from the coarse analog voltages V(1) to V($2^M$+1) output by the reference voltage resource 340 based on the M-bit first portion data MSB1 in the corresponding digital data DD1 as the outputs A2 and A1 thereof. For example, the coarse selector 610 selects the coarse analog voltages V(3) and V(2) from the coarse analog voltages V(1) to V($2^M$+1) as the outputs A2 and A1 thereof.

The second voltage divider 630 divides voltages based on the coarse analog voltages V(j) and V(j−1) selected by the coarse selector 610 (i.e. the output voltages A2 and A1 thereof) to produce $2^L$ fine analog voltages B(1) to B($2^L$) of different levels. The output selector 640 selects one of the fine analog voltages B(1) to B($2^L$) based on the L-bit second portion data LSB1 in the corresponding digital data DD1 to output it as the analog output data AD1.

FIGS. 7A to 7D illustrate the second voltage divider according to various embodiments of the present invention. In the two embodiments as shown in FIGS. 5 and 6, the voltage dividers 530 and 630 can be implemented with reference to FIGS. 7A, 7B, 7C, or 7D. For example, the voltage divider in FIG. 7A includes $2^L$ resistors, which are connected in series between the output voltages A2 and A1 output by the coarse selector 610 (or by the first selector 510 and the second selector 520 respectively) to divide voltages and thus to obtain fine analog voltages B(1) to B($2^L$). Even though only resistor strings are illustrated in FIGS. 7A to 7D, a plurality of buffers can be disposed whereto by those skilled in the art according to the actual requirement so that the fine analog voltages B(1) to B($2^L$) obtained through resistor string voltage dividing can be provided to the output selector 640 (or 540) through the buffers.

In overview, ($2^{M+L}$) analog reference voltages are required in a conventional (M+L)-bit DAC, accordingly ($2^{M+L}$) analog voltage lines are required to be laid out within a conventional digital-to-analog conversion unit, thus a lot of chip area is taken by the analog voltage lines. In particular, the higher the resolution, the larger the area taken by the analog voltage lines. Compared to the conventional technology, only $2^M$+1 coarse analog voltages are required in an (M+L)-bit DAC of the present invention, accordingly only ($2^M+1$) analog voltage lines are required in a digital-to-analog conversion unit of the present invention. Therefore, the present invention can greatly reduce the number of analog voltage lines in the digital-to-analog conversion unit. Consequently, the chip area and the manufacturing cost can be reduced considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for driving display panel, comprising:
   a data latch unit, used for receiving and latching at least one input data stream and outputting N digital latch data based on the latch result thereof, wherein each digital latch data is (M+L)-bit, and N, M, and L are all positive integers greater than 0;
   a reference voltage source, used for providing $2^M+1$ coarse analog voltages V(i) having different levels, wherein V(i) represents the ith coarse analog voltage, i is an integer, and $0<i\leq 2^M+1$;
   a digital-to-analog conversion unit, coupled to the data latch unit and the reference voltage source, the digital-to-analog conversion unit including N digital-to-analog converters (DACs), wherein each DAC selects two of the coarse analog voltages based on the M-bit first portion data in a corresponding digital latch data, and produces the corresponding analog output data based on the selected two coarse analog voltages and the L-bit second portion data in the corresponding digital latch data; and
   an output buffer unit, coupled to the digital-to-analog conversion unit, the output buffer unit including N output buffers, wherein each output buffer corresponding coupled to one DAC, used for bringing the analog output data provided by the DAC to an expected analog voltage level.

2. The apparatus as claimed in claim 1, wherein the reference voltage source includes:
   a first voltage divider, used for producing the coarse analog voltages V(i) based on a first constant voltage and a second constant voltage; and
   a plurality of buffers, electrically connected to the first voltage divider, used for buffering the coarse analog voltages V(i) output by the first voltage divider.

3. The apparatus as claimed in claim 2, wherein the first constant voltage is a system voltage or a voltage produced by a first voltage regulator, the second constant voltage is a ground voltage or a voltage produced by a second voltage regulator.

4. The apparatus as claimed in claim 2, wherein the first voltage divider includes at least $2^M$ first resistors connected in series.

5. The apparatus as claimed in claim 1, wherein each of the DACs of the digital-to-analog conversion unit includes:
   a first selector, electrically connected to the reference voltage source, used for selecting a coarse analog voltage V(j) based on the M-bit first portion data in the corresponding digital latch data, wherein j is an integer and $1<j\leq 2^M+1$;
   a second selector, electrically connected to the reference voltage source, used for selecting a coarse analog voltage V(j−1) based on the M-bit first portion data in the corresponding digital latch data;
   a second voltage divider, electrically connected to the first selector and the second selector, used for dividing voltages based on the coarse analog voltages V(j) and V(j−1) selected respectively by the first selector and the second selector to produce $2^L$ fine analog voltages of different levels; and
   an output selector, electrically connected to the second voltage divider, used for selecting one of the fine analog voltages based on the L-bit second portion data in the corresponding digital latch data and outputting it as the analog output data.

6. The apparatus as claimed in claim 1, wherein each of the DACs of the digital-to-analog conversion unit includes:
   a coarse selector, electrically connected to the reference voltage source, used for selecting the coarse analog voltages V(j) and V(j−1) based on the M-bit first portion data in the corresponding digital latch data, wherein j is an integer and $1<j\leq 2^M+1$;
   a second voltage divider, electrically connected to the coarse selector, used for dividing voltages based on the coarse analog voltages V(j) and V(j−1) selected by the coarse selector to produce $2^L$ fine analog voltages having different levels; and
   an output selector, electrically connected to the second voltage divider, used for selecting one of the fine analog voltages based on the L-bit second portion data in the corresponding digital latch data and outputting it as the analog output data.

7. The apparatus as claimed in claim 1, wherein the data latch unit includes:
   a shift register, used for gradually shifting the received first control signal based on a clock signal to output (N/3) latch signals of different phases;
   a first line latch, electrically connected to the shift register, used for receiving and latching the input data stream based on the latch signals;
   a second line latch, electrically connected to the first line latch, used for receiving and latching the latch result of the first line latch based on a second control signal; and
   a level shifter, electrically connected to the second line latch, used for outputting the digital latch data based on the latch result of the second line latch.

8. The apparatus as claimed in claim 1, wherein the display panel is an liquid crystal display (LCD) panel.

9. The apparatus as claimed in claim 1, wherein the display panel is an liquid crystal display (LCD) panel.

10. An apparatus for driving display panel, comprising:
    a data latch unit, used for receiving and latching at least one input data stream and outputting N digital latch data based on the latch result thereof, wherein each digital latch data is (M+L)-bit, and N, M, and L are all positive integers greater than 0;
    a reference voltage source, used for providing $2^M+1$ coarse analog voltages V(i) having different levels, wherein V(i) represents the ith coarse analog voltage, i is an integer, and $0<i\leq 2^M+1$, the reference voltage source comprises:
       a first voltage divider, used for producing the coarse analog voltages V(i) based on a first constant voltage and a second constant voltage; and
       a plurality of buffers, electrically connected to the first voltage divider, used for buffering the coarse analog voltages V(i) output by the first voltage divider,
       when the first constant voltage is a system voltage or a voltage produced by a first voltage regulator, the second constant voltage is a ground voltage or a voltage produced by a second voltage regulator; and a digital-to-analog conversion unit, coupled to the data latch unit and the reference voltage source, the digital-to-analog conversion unit including N digital-to-analog converters (DACs), wherein each DAC selects two of the coarse analog voltages based on the M-bit first portion data in a corresponding digital latch data and produces the corresponding analog output data based on the selected two coarse analog voltages and the L-bit second portion data in the corresponding digital latch data.

11. The apparatus as claimed in claim 10, wherein the first voltage divider includes at least 2M first resistors connected in series.

12. The apparatus as claimed in claim 10, wherein each of the DACs of the digital-to-analog conversion unit includes:

a first selector, electrically connected to the reference voltage source, used for selecting a coarse analog voltage V(j) based on the M-bit first portion data in the corresponding digital latch data, wherein j is an integer and $1<j\leq2^M+1$;

a second selector, electrically connected to the reference voltage source, used for selecting a coarse analog voltage V(j−1) based on the M-bit first portion data in the corresponding digital latch data;

a second voltage divider, electrically connected to the first selector and the second selector, used for dividing voltages based on the coarse analog voltages V(j) and V(j−1) selected respectively by the first selector and the second selector to produce $2^L$ fine analog voltages of different levels; and an output selector, electrically connected to the second voltage divider, used for selecting one of the fine analog voltages based on the L-bit second portion data in the corresponding digital latch data and outputting it as the analog output data.

13. The apparatus as claimed in claim 10, wherein each of the DACs of the digital-to-analog conversion unit includes:

a coarse selector, electrically connected to the reference voltage source, used for selecting the coarse analog voltages V(j) and V(j−1) based on the M-bit first portion data in the corresponding digital latch data, wherein j is an integer and $1<j\leq2^M+1$;

a second voltage divider, electrically connected to the coarse selector, used for dividing voltages based on the coarse analog voltages V(j) and V(j−1) selected by the coarse selector to produce $2^L$ fine analog voltages having different levels; and an output selector, electrically connected to the second voltage divider, used for selecting one of the fine analog voltages based on the L-bit second portion data in the corresponding digital latch data and outputting it as the analog output data.

14. The apparatus as claimed in claim 10, wherein the data latch unit includes:

a shift register, used for gradually shifting the received first control signal based on a clock signal to output (N/3) latch signals of different phases;

a first line latch, electrically connected to the shift register, used for receiving aid latching the input data stream based on the latch signals;

a second line latch, electrically connected to the first line latch, used for receiving and latching the latch result of the first line latch based on a second control signal; and a level shifter, electrically connected to the second line latch, used for outputting the digital latch data based on the latch result of the second line latch.

15. An apparatus for driving display panel, comprising:

a data latch unit, used for receiving and latching at least one input data stream and outputting N digital latch data based on the latch result thereof, wherein each digital latch data is (M+L)-bit, and N, M, and L are all positive integers greater than 0;

a reference voltage source, used for providing $2^M+1$ coarse analog voltages V(i) having different levels, wherein V(i) represents the ith coarse analog voltage, i is an integer, and $0<i\leq2^M+1$, the reference voltage source comprises:

a first voltage divider, used for producing the coarse analog voltages V(i) based on a first constant voltage and a second constant voltage; and a plurality of buffers, electrically connected to the first voltage divider, used for buffering the coarse analog voltages V(i) output by the first voltage divider, wherein the first constant voltage is a system voltage or a voltage produced by a first voltage regulator, the second constant voltage is a ground voltage or a voltage produced by a second voltage regulator; and a digital-to-analog conversion unit, coupled to the data latch unit and the reference voltage source, the digital-to-analog conversion unit including N digital-to-analog converters (DACs), wherein each DAC selects two of the coarse analog voltages based on the M-bit first portion data in a corresponding digital latch data, and produces the corresponding analog output data based on the selected two coarse analog voltages and the L-bit second portion data in the corresponding digital latch data; and an output buffer unit, coupled to the digital-to-analog conversion unit, the output buffer unit including N output buffers, wherein each output buffer corresponding coupled to one DAC, used for bringing the analog output data provided by the DAC to an expected analog voltage level.

16. The apparatus as claimed in claim 15, wherein the first voltage divider includes at least 2M first resistors connected in series.

17. The apparatus as claimed in claim 15, wherein each of the DACs of the digital-to-analog conversion unit includes:

a first selector, electrically connected to the reference voltage source, used for selecting a coarse analog voltage V(j) based on the M-bit first portion data in the corresponding digital latch data, wherein j is an integer and $1<j\leq2^M+1$;

a second selector, electrically connected to the reference voltage source, used for selecting a coarse analog voltage V(j−1) based on the M-bit first portion data in the corresponding digital latch data;

a second voltage divider, electrically connected to the first selector and the second selector, used for dividing voltages based on the coarse analog voltages V(j) and V(j−1) selected respectively by the first selector and the second selector to produce $2^L$ fine analog voltages of different levels; and an output selector, electrically connected to the second voltage divider, used for selecting one of the fine analog voltages based on the L-bit second portion data in tile corresponding digital latch data and outputting it as data analog output data.

18. The apparatus as claimed in claim 15, wherein each of the DACs of the digital-to-analog conversion unit includes:

a coarse selector, electrically connected to the reference voltage source, used for selecting the coarse analog voltages V(j) and V(j−1) based on the M-bit first portion data in the corresponding digital latch data, wherein j is an integer and $1<j\leq 2^M+1$;

a second voltage divider, electrically connected to the coarse selector, used for dividing voltages based on the coarse analog voltages V(j) and V(j−1) selected by the coarse selector to produce $2^L$ fine analog voltages having different levels; and an output selector, electrically connected to the second voltage divider, used for selecting one of the fine analog voltages based on the L-bit second portion data in the corresponding digital latch data and outputting it as the analog output data.

19. The apparatus as claimed in claim 15, wherein the data latch unit includes:

a shift register, used for gradually shifting the received first control signal based on a clock signal to output (N/3) latch signals of different phases;

a first line latch, electrically connected to the shift register, used for receiving and latching the input data stream based on the latch signals;

a second line latch, electrically connected to the first line latch, used for receiving and latching the latch result of the first line latch based on a second control signal; and a level shifter, electrically connected to the second line latch, used for outputting the digital latch data based on the latch result of the second line latch.

20. The apparatus as claimed in claim 15, wherein the display panel is an liquid crystal display (LCD) panel.

* * * * *